(12) United States Patent
Pflederer

(10) Patent No.: US 9,287,893 B1
(45) Date of Patent: Mar. 15, 2016

(54) ASIC BLOCK FOR HIGH BANDWIDTH LZ77 DECOMPRESSION

(71) Applicant: GOOGLE INC., Mountain View, CA (US)

(72) Inventor: Keith Robert Pflederer, Mountain View, CA (US)

(73) Assignee: GOOGLE INC., Mountain View, CA (US)

( * ) Notice: Subject to any disclaimer, the term of this patent is extended or adjusted under 35 U.S.C. 154(b) by 0 days.

(21) Appl. No.: 14/702,420

(22) Filed: May 1, 2015

(51) Int. Cl.
*H03M 7/30* (2006.01)
*G06F 3/06* (2006.01)

(52) U.S. Cl.
CPC ........... *H03M 7/3086* (2013.01); *G06F 3/0641* (2013.01)

(58) Field of Classification Search
CPC .. H03M 7/3084; H03M 7/3086; G06F 3/0641
See application file for complete search history.

(56) References Cited

U.S. PATENT DOCUMENTS

| 5,521,597 | A | 5/1996 | Dimitri | |
|---|---|---|---|---|
| 5,525,982 | A * | 6/1996 | Cheng | H03M 7/3086 341/106 |
| 5,532,694 | A * | 7/1996 | Mayers | G06T 9/005 341/67 |
| 6,145,069 | A | 11/2000 | Dye | |
| 6,262,675 | B1 | 7/2001 | Iyer | |
| 6,883,037 | B2 | 4/2005 | Kadatch et al. | |
| 8,106,799 | B1 | 1/2012 | Yang et al. | |
| 8,350,732 | B2 * | 1/2013 | Carlson | H03M 7/3086 341/51 |
| 8,711,164 | B2 | 4/2014 | Dye | |
| 8,854,235 | B1 | 10/2014 | Tseng et al. | |
| 8,933,824 | B1 | 1/2015 | Agarwal et al. | |
| 8,947,270 | B2 | 2/2015 | Gopal et al. | |

OTHER PUBLICATIONS

Zito-Wolf, A Broadcast/Reduce Architecture for High-speed Data Compression, Proceedings of the Second IEEE Symposium onParallel and Distributed Processing, Dec. 1990, IEEE, p. 174-181.*

* cited by examiner

*Primary Examiner* — Howard Williams
(74) *Attorney, Agent, or Firm* — Birch, Stewart, Kolasch & Birch, LLP

(57) ABSTRACT

Disclosed is an integrated circuit having a decompression block. The decompression block is configured as a pipeline that may include a length module and a distance module. The length module evaluates a length for each symbol. The distance module may resolve distances in an at least one length-distance pair. The length module may include a shifter stage configured to store two consecutive words, and control a sliding window of symbols, in order to extract literals or distances. The length module may include a mapper stage configured to map the literals or distances to positions in the output stream. The distance module may include a pointer replacement stage and a resolution stage. The pointer replacement stage configured to replace distances, represented as pointers within an output word, with either literals or other pointers to prior words. The resolution stage configured to replace the other pointers with literals, and output the literals.

10 Claims, 14 Drawing Sheets

ASIC BLOCK FOR HIGH BANDWIDTH LZ77 DECOMPRESSION

BACKGROUND

The present disclosure relates to decompression of a compressed data stream. The present disclosure relates to decompression of compressed data having a length and distance, or offset, encoding, such as the LZ77 compression technique. The disclosure includes decompression hardware which is described as a functional block to be integrated into an Application Specific Integrated Circuit (ASIC) as part of a System on Chip (SOC). The decompression hardware can be applied to decompression of data stored in main memory of a computer system. The decompression hardware may make use of existing hardware components. The decompression technique is applicable to a software, or hybrid software and hardware implementation.

LZ77 is a known compression technique which removes redundancy from a byte stream by replacing a string of bytes that repeats within the input stream with a reference, or pointer, to a prior instance of the same bytes. The reference is encoded as a <length, distance> pair, where length is the number of bytes being replaced and distance is the number of bytes prior in the input stream where the prior instance occurred. The output of LZ77 compression is a sequence of symbols which represent either literal bytes or <length, distance> pairs.

The LZ77 technique lends itself to a sequential decompression, as the bytes produced by any symbol may depend on the bytes produced by any prior symbol. The sequential nature of the decompression process imposes a limit on the rate that decompression can be performed.

It is estimated that LZ77 decompression implemented in software may achieve about 1 GB/s.

Some operating systems provide a feature of using a portion of main memory as a swap device. There is a need to compress data for storing in the swap device, for example, in cases where the amount of data to be stored is large and it is desired to limit the size of main memory. The swap device is used to store data that has not been recently used. The swap device can be used to compress and store data that has not been recently used, as data that is less likely to be used in the near future. Subsequently, when a page fault occurs, the needed data is obtained from the swap device by way of decompression processing. It is desired to make such decompression processing as fast as possible in order to avoid incurring a significant penalty that would negate the benefit of using compression to store data in main memory.

Various approaches have been devised to speed up decompression, including decompression of data that has been compressed using the LZ77 compression technique. In an example, a decoder is configured to decode up to 4 codewords at a time, guaranteeing minimum throughput of 4F symbols or Bytes/second, where F is the clock frequency.

However, for doing decompression of data maintained in a portion of main memory, it is considered necessary to obtain a much higher decompression rate than known approaches, together with maximizing bandwidth. Example embodiments of the disclosed invention are expected to achieve 16 GB/s decompression rate.

SUMMARY

This Summary introduces a selection of concepts in a simplified form in order to provide a basic understanding of some aspects of the present disclosure. This Summary is not an extensive overview of the disclosure, and is not intended to identify key or critical elements of the disclosure or to delineate the scope of the disclosure. This Summary merely presents some of the concepts of the disclosure as a prelude to the Detailed Description provided below.

The present disclosure generally relates to integrated circuits and methods for decompressing a stream of symbols into original literals.

An aspect is an integrated circuit, comprising a decompression block that receives as input a compressed input stream made up of symbols in M words, each word having up to N symbols, where M and N are a positive integers, and that outputs an uncompressed output stream made up of an array of literals, the array of literals being original literals before compression; the decompression block is configured as a pipeline that includes a length module and a distance module, the length module evaluates a length for each symbol, the distance module resolves the distances in the at least one length-distance pair; the length module comprising a shifter stage configured to store two consecutive words, and control a sliding window of S symbols, where S is a positive integer, in accordance with end word values in order to extract literals or distances, the end word values represent the number of uncompressed words between the start of the first symbol and the end of a current symbol; a mapper stage configured to receive the literals or distances from the sliding window and using end byte values map the literals or distances to positions in the output stream, the end byte values represent the absolute position in the output stream where a given symbol ends; the distance module comprising a pointer replacement stage configured to replace distances, represented as pointers within an output word, with either literals or other pointers to prior words; a resolution stage configured to replace the other pointers with literals, and output literals and the replacement literals to the uncompressed output stream.

In a further aspect, the length module further comprises an end value pipeline having a plurality of stages that calculate for each of the N symbols an end value as a cumulative length from a first symbol to the Nth symbol in the array of N symbols; and a symbol position stage that adds an end byte from a last symbol of a previous word to the cumulative length for each symbol and that splits each end value into an end byte and an end word, to obtain the end byte values and the end word values.

In a further aspect, the end values are split into two equal sized fields.

In a further aspect, the plurality of stages in the end value pipeline include adders that perform cumulative additions based on results of earlier stage adders, wherein adders are split across two or more of the stages.

In a further aspect, the shifter stage uses the end word values to determine that remaining bits in the sliding window are read from the second of the two consecutive words, and to determine that a new word needs to be accepted from a prior stage.

In a further aspect, the pointer replacement stage and the resolution stage are pipelines.

In a further aspect, the pipeline in the resolution stage has Depth+1 stages, where Depth is a dictionary size in bytes divided by 16.

In a further aspect, the resolution stage has two steps in which, in the first step pointers longer than a predetermined distance are resolved by lookup in an external memory, and the second step resolves pointers in a pipeline.

An aspect is a method of decompressing a compressed input stream of symbols to produce an output stream of literals, comprising performing a length operation on the input stream to produce an array of literal bytes and distances; performing a distance operation to produce an array of literals from the array of literal bytes and distances, wherein the length operation comprises receiving a word from the input stream of symbols, the word including N symbols; performing a shifter stage, the shifter stage stores two consecutive words from the input stream, and controls a sliding window of S symbols, where S is a positive integer, in accordance with end word values in order to extract literals or distances, the end word values represent the number of uncompressed words between the start of the first symbol and the end of a current symbol; performing a mapper stage to receive the literals or distances from the sliding window and using end byte values to map the literals or distances to positions in the output stream, the end byte values represent the absolute position in the output stream where a given symbol ends; wherein the distance operation comprises performing a pointer replacement stage to replace distances, represented as pointers within an output word, with either literals or other pointers to prior words; performing a resolution stage to replace the other pointers with literals; and outputting to the output stream an array of literals based on the replaced pointers.

In a further aspect, the length operation further comprises calculating for each of the N symbols an end value as a cumulative length from a first symbol to the Nth symbol in the array of N symbols; adding an end byte from a last symbol of a previous word to the cumulative length for each symbol; and splitting each end value into an end byte and an end word, to obtain the end byte values and the end word values.

Further scope of applicability of the methods and systems of the present disclosure will become apparent from the Detailed Description given below. However, it should be understood that the Detailed Description and specific examples, while indicating embodiments of the methods and systems, are given by way of illustration only, since various changes and modifications within the spirit and scope of the concepts disclosed herein will become apparent to those skilled in the art from this Detailed Description.

Further scope of applicability of the methods and systems of the present disclosure will become These and other aspects are described with respect to the drawings. The teachings of the disclosed application can be readily understood by considering the following detailed description in conjunction with the accompanying drawings.

BRIEF DESCRIPTION OF THE SEVERAL VIEWS OF THE DRAWINGS

These and other objects, features, and characteristics of the present disclosure will become more apparent to those skilled in the art from a study of the following Detailed Description in conjunction with the appended claims and drawings, all of which form a part of this specification.

Further scope of applicability of the methods and systems of the present disclosure will become The figures depict embodiments of the disclosed invention for purposes of illustration only. One skilled in the art will recognize from the following discussion that alternative embodiments of the structures and methods illustrated herein may be employed without departing from the principles of the invention described herein.

DETAILED DESCRIPTION

The following description refers to the accompanying drawings. The following description is not intended to limit the scope. Instead, the scope is defined by the appended claims.

In an example embodiment, data for a swap device in main memory of a computer system is compressed in 4K pages. In the event of a page fault, data stored in the swap device is formed as an input stream for a decompression integrated circuit. In an example embodiment, the dictionary may be 256 bytes. In an example embodiment, a functional block is disclosed that takes as input an array of 16 symbols representing the next 16 symbols in a compressed stream and produces as output an array of 16 bytes representing the next 16 bytes in the uncompressed stream.

The disclosure is not limited to an array size of 16 symbols. The array size may be adjusted by, for example, powers of 2, but may be any arbitrary width.

In addition, it is also possible to set the size of the output to be larger than the size of the input. In such case, compression would result in fewer input symbols than output bytes.

A technique for compressing the data for the swap device is the LZ77 compression algorithm. LZ77 is a lossless compression technique that produces as an output, a sequence of symbols which represent either literal bytes or <length, distance> pairs. The length represents the number of bytes being replaced. The distance represents the number of bytes prior in the input stream where the prior instance occurred.

For example, the sequence "AABCBBABC" may be compressed as:

<len=0, dist=0>
<literal A>
<len=1, dist=1>
<len=0, dist=0>
<literal B>
<len=0, dist=0>
<literal C>
<length=1, dist=2>
<len=1, dist=1>
<len 3, dist=5>

In this compressed sequence, the last length-distance pair means that a sequence ABC is repeated from a previous sequence 5 bytes earlier in the stream.

It is possible for a sequence of symbols to have a length that is longer than distance. For example, the sequence "ABABA-BAB" would be encoded as <literal A>, <literal B>, <len=6, dist=2>.

The compressed stream of length-distance pairs and literals is provided as the input stream for disclosed embodiments. The output stream would contain the original sequence of literals. Embodiments of a functional block for decompression take as input an array of 16 symbols from the input stream.

<Functional Block for ASIC>

Figure 1:
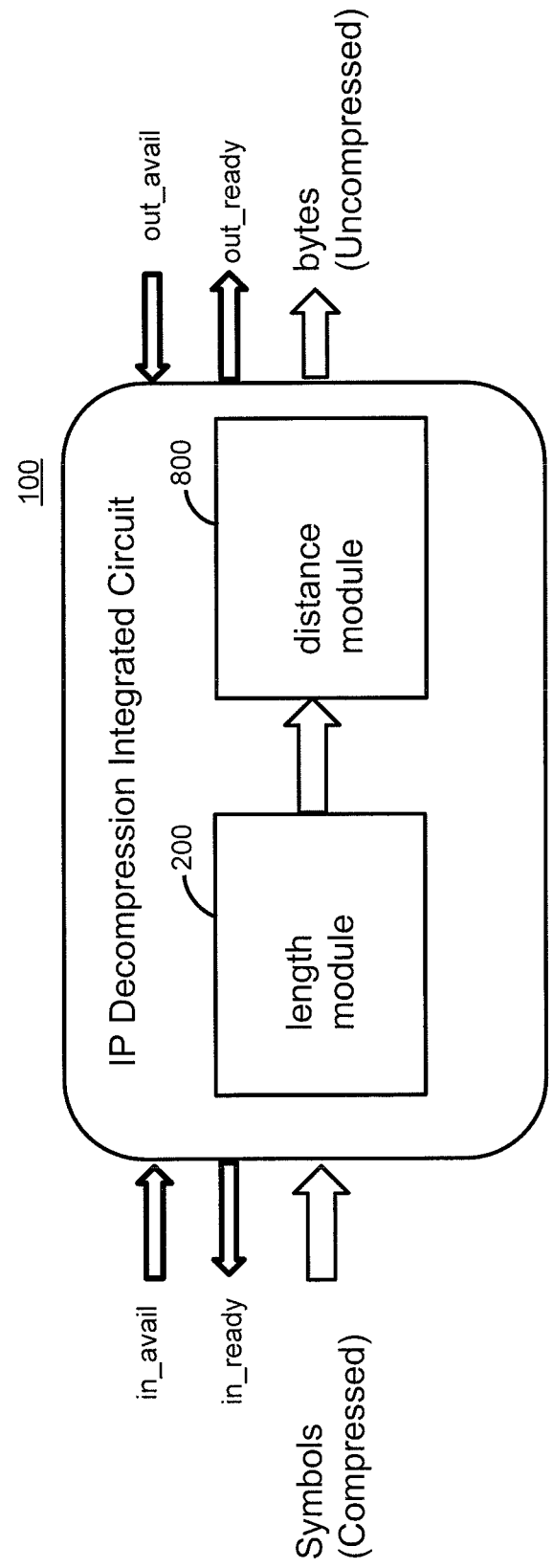
FIG. 1 is a block diagram of modules that make up the block to be integrated.

FIG. 1 illustrates a block diagram for an example embodiment of the functional block 100. The example embodiment may be in the form of a hardware description language, and in particular Register-transfer level (RTL) code. A disclosed approach avoids a highly serialized approach and significantly speeds up the decompression rate. In the disclosed approach the decompression functional block (IP Decompression Integrated Circuit 100) is arranged as a pipeline that divides the decompression into a length module 200 and a distance module 800. The length module 200 performs an operation to expand the lengths, while the distance module 800 performs an operation to resolve the distances. In other words, the length module 200 processes the lengths in the length-distance pairs of the input stream, while the distance module 800 processes the distances.

The length module 200, prior to processing in stages of a pipeline, determines a width in bytes of each symbol. The length module 200 determines an end_byte and an end_word for each symbol in a current word being processed. Also, the distance module 800 converts distances into pointers, and involves a step in which pointers may be resolved into new pointers, before finally being resolved as literals. These features contribute to control of processing in the pipeline the enables achievement of very high decompression rates and maximum bandwidth.

The functional block 100 includes control inputs and outputs for controlling timing of transfer of sets of symbols. An in_avail input and in_ready output control the transfer of a new set of symbols into the functional block 100. The in_avail is set when there are more symbols in the input stream. The in_ready is set when the pipeline is ready for another set of symbols. An out_avail output and out_ready input control the transfer of bytes out of the functional block 100. The out_ready is set when the output stream is ready to accept more decompressed data. The out_avail is set when data is available from the pipeline.

Embodiments of the functional block 100 may include an Intellectual Property (IP) core as part of a System On Chip (SOC).

<Pipeline>

Figure 2:
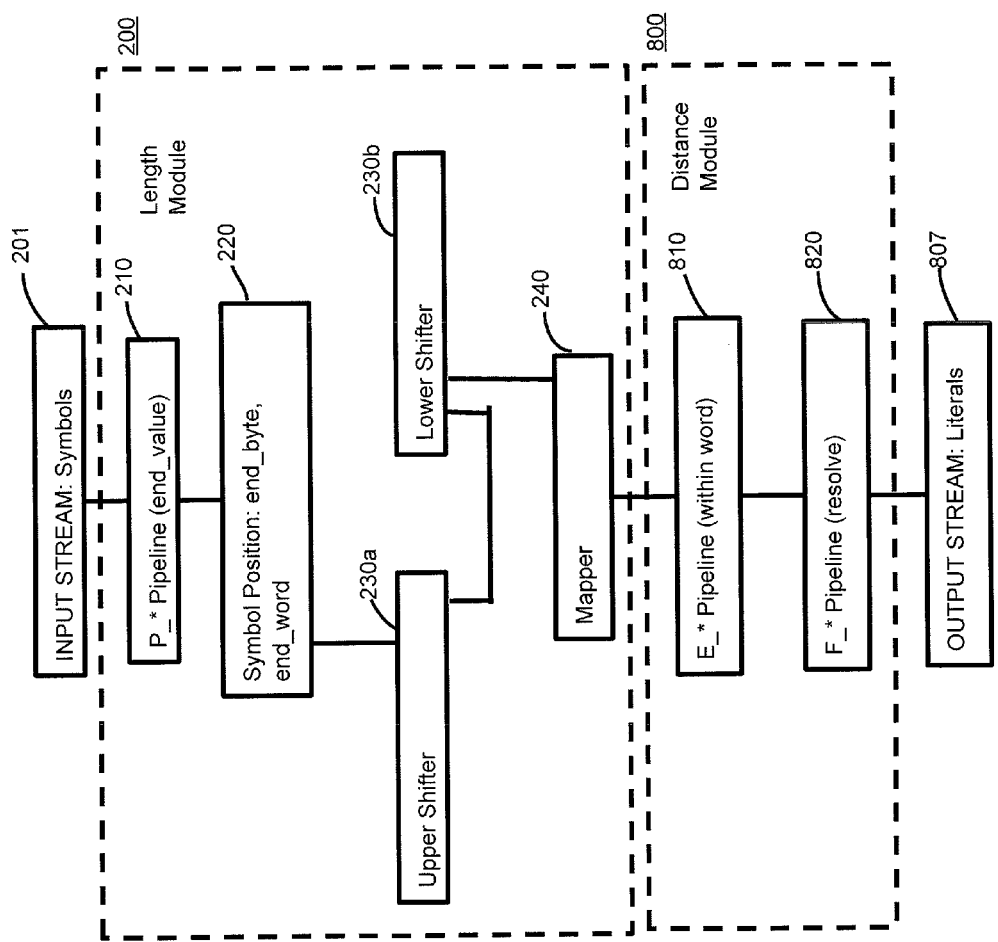
FIG. 2 is a block diagram showing pipelined stages provided in the modules.

FIG. 2 is a block diagram showing the high-level stages in the pipeline. The functional block 100 may be implemented as a pipelined structure. In an example embodiment, the functional block accepts as input an array of 16 symbols, representing the next 16 symbols in the input stream 201 of symbols resulting from compression.

Stage 210 is itself a pipeline (hereinafter, "P" Pipeline). The P pipeline calculates an end value for each of the 16 symbols. The end value represents the cumulative length from the first symbol in the 16-symbol word. The pipeline performs this calculation in multiple stages. In the case of the 16-symbol words, there are five stages in the P pipeline.

Stage 220 is referred to as a symbol positioning stage. Stage 220 adds the end_byte from the last symbol of the previous word to the cumulative length of each symbol. The Stage 220 then separates the end values from Stage 210 into an end_byte, and an end_word. The end_byte is Bits[N:0] of the end value and indicates the absolute position in the output where a given symbol ends (plus 1 mod 16); N is an integer, for example 3. The remaining bits are the end_word, which indicates the number of uncompressed 16 byte words from the end of the last 16-byte symbol to complete prior to the current 16-symbol compressed word.

Stage 230 is referred to as the shifter stage, comprising of an upper shift register 230a and a lower shift register 230b. The shifter stage holds two consecutive 16-symbol words. A sliding window extracts the symbols required to produce the next 16-byte output word and sends the extracted symbols to the next stage 240. The logic of the shifter stage is such that the sliding window may overlap symbols in both of the shift registers as it moves to a set of symbols that constitute an output word. In other words, the shifter state containing two shift registers 230a, 230b enables the sliding window to read past the end of one register, in the case that part of an output word exists at the end of a shift register.

Stage 240 is referred to as the mapper stage. The mapper stage receives the symbols and end_byte values from the sliding window and maps the symbols to their appropriate positions in the output stream, repeating symbols as necessary. Results of the mapper stage are that each symbol represents exactly one byte, and all symbols are either literal bytes or distances (which point to an earlier symbol that needs to be repeated.).

Stage 810 is the first stage in the distance module 800. Stage 820 is a second stage in the distance module 800. It is noted that it is possible to reverse the order of these two stages.

Stage 810 is itself a pipeline (hereinafter, "E" Pipeline). The E Pipeline resolves pointers within the same output word, and includes a number of pipeline stages. This stage resolves pointers into either literal values or pointers to prior words. In an example embodiment, there are four stages in the E Pipeline.

Stage 820 is also a pipeline (hereinafter, "F" Pipeline). The F Pipeline resolves pointers to prior output words. The F Pipeline resolves pointers using a DEPTH+1 stage pipeline, where DEPTH resents the maximum distance divided by the number of bytes per output word. For an example dictionary of 256 bytes and a 16 byte output word, the number of stages in the F Pipeline is 17. The final stage in the F Pipeline outputs literals The F Pipeline updates pointers as the referred-to bytes come off the end of the pipeline. An alternative approach would be to save the recent bytes in an array and use a lookup port in the array to resolve the pointers. This later approach would require an additional array register, control complexity and performance degradation to resolve simultaneous references to array entries.

The number of gates in the integrated circuit that would be generated from this design is proportional to the number of stages. Also, a greater the number of stages leads to an increase in latency. Thus, it is preferable to minimize the stages (hardware complexity). The arrangement of stages 210 to 810 would complete the decompression process in the minimum number of stages. Thus, the arrangement of the pipeline in FIG. 2 is considered to be optimal.

<Length Module-Functional Arrangement>

Figure 3:
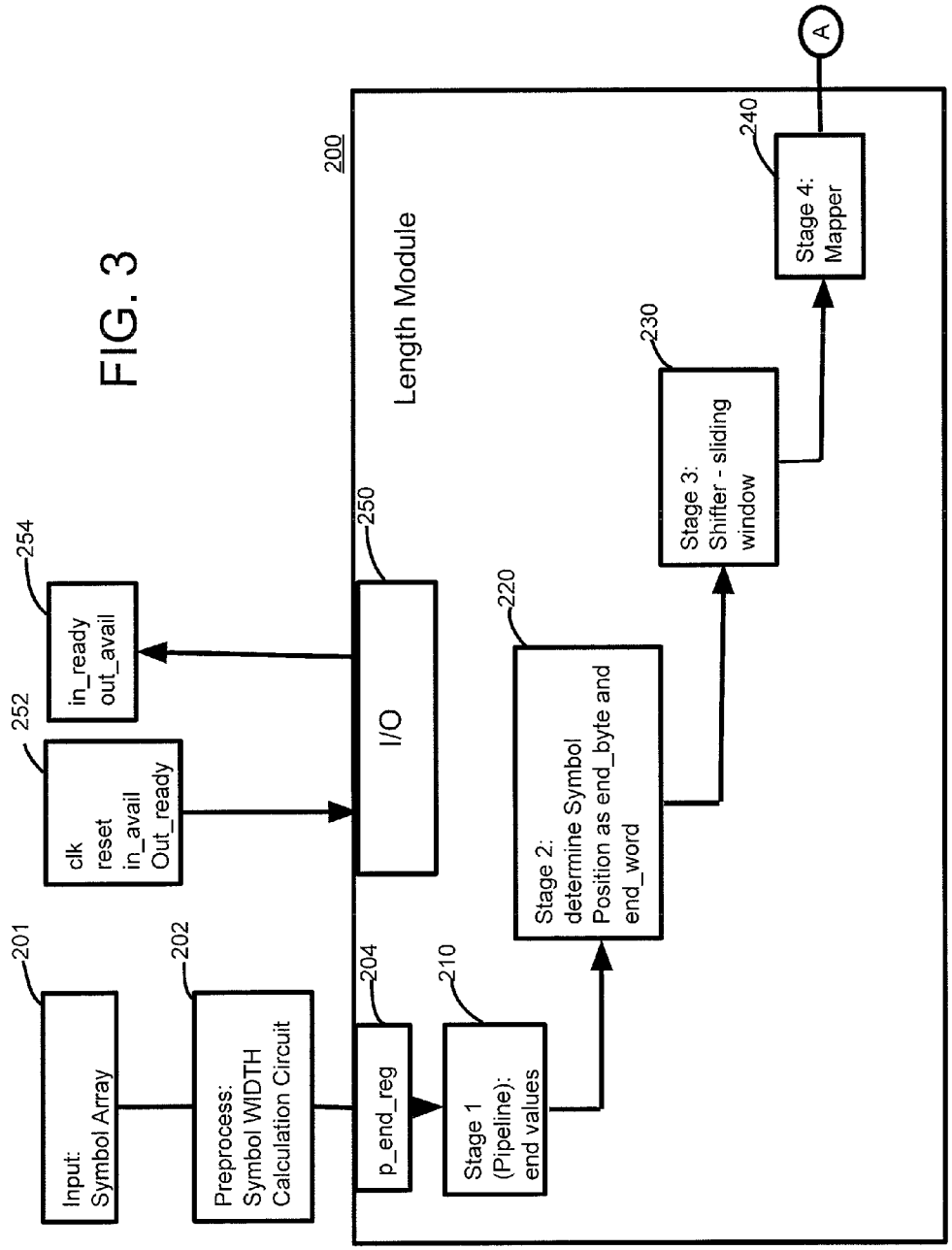
FIG. 3 is a block diagram of the Length Module.

FIG. 3 illustrates a block diagram for an example embodiment of the Length Module 200. The Length Module 200 expands the lengths by way of processing by a set of stages in the pipeline. In this module, the length is removed from the length-distance pairs, making them <distance> symbols. A first stage in the Length Module 200 is itself a pipeline (Stage 1: end_value pipeline 210). In addition to an input of a symbol array 201, the Length Module 200 takes as input a clock signal, reset signal, in_avail signal, and an out_ready signal, and generates as output, an in_ready signal and an out_available signal.

Before processing by the end_value pipeline begins, a width calculation circuit 202 calculates a width in bytes of each data symbol. Invalid symbols are zero bytes wide, literal symbols are 1 byte wide, and <length, distance> symbols are length bytes wide. In particular, the width calculation circuit 202 inserts the length of each symbol into a p_end_reg register 204 for each respective symbol.

The Length Module 200 is a pipeline that includes Stage 1: end_value pipeline 210, Stage 2: Symbol Positioning 220, Stage 3: Shifter 230, and Stage 4: Mapper 240. The Length Module 200 produces as output literal bytes or distances mapped to their appropriate positions in the output stream.

Figure 4:
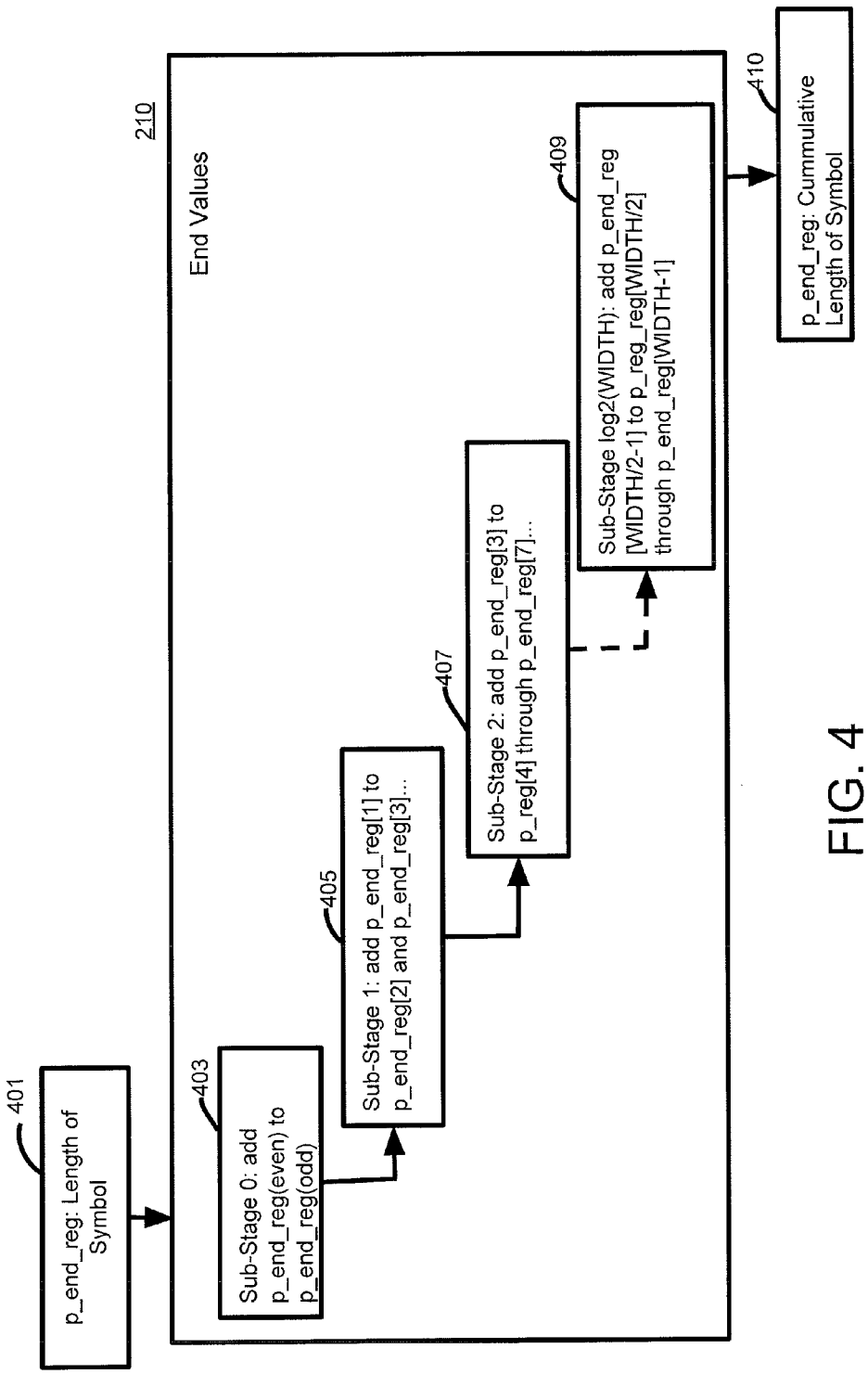
FIG. 4 is a block diagram of the End_Values Stage in the Length Module.

FIG. 4 is a block diagram illustrating Stage 1 (210) of the Length Module 200. In Stage 1, the end_value of each of the 16 symbols in a word is calculated in pipelined stages. The end_value represents the cumulative length from the first symbol in the 16-symbol word. The end_values are calculated in approximately log 2(WIDTH) stages.

In particular, the Stage 1 pipeline 210 generates the cumulative length from the start of the word (symbol 0) to the end of each symbol within the word. Because Stage 1 is a pipeline, stages in this pipeline are referred to as sub-stages.

The sub-stage zero (403) adds the p_end_reg for the even symbols to p_end_reg for the odd symbols.

The sub-stage 1 (405) adds p_end_reg[1] to p_end_reg[2] and p_end_reg[3], p_end_reg[5] to p_end_reg[6] and p_end_reg[7], and so on.

The sub-stage 2 (407) adds p_end_reg[3] to p_end_reg[4] through p_end_reg[7] and adds p_end_reg[11] to p_end_reg[12] through p_end_reg[15].

This continues to sub-stage log 2(WIDTH) (409) in which p_end_reg[WIDTH/2−1] is added to p_end_reg[WIDTH/2] through p_end_reg[WIDTH−1]. After this stage, p_end_reg for each symbol holds the cumulative length.

In an example embodiment, to reduce timing pressure and keep the adders as small as possible, the adds may be done in two equal size chunks, with the add for the more significant bits happening a cycle late. In particular, each add operation may be split across 2 or more pipe stages.

For example, the end values may be split into two equal sized fields. In the first pipe sub-stage 1 all the adds from sub-stage zero are completed on the lower bits, saving a carry bit. In sub-stage 1 all the adds from sub-stage zero are completed on the upper bits plus the saved carry bit. Also in sub-stage 1 the adds from sub-stage 2 are completed on the lower bits.

A result of the end_value pipeline in Stage 1 of the Length Module 200, is the vector p_end_reg for each symbol containing a cumulative length 410.

Figure 5:
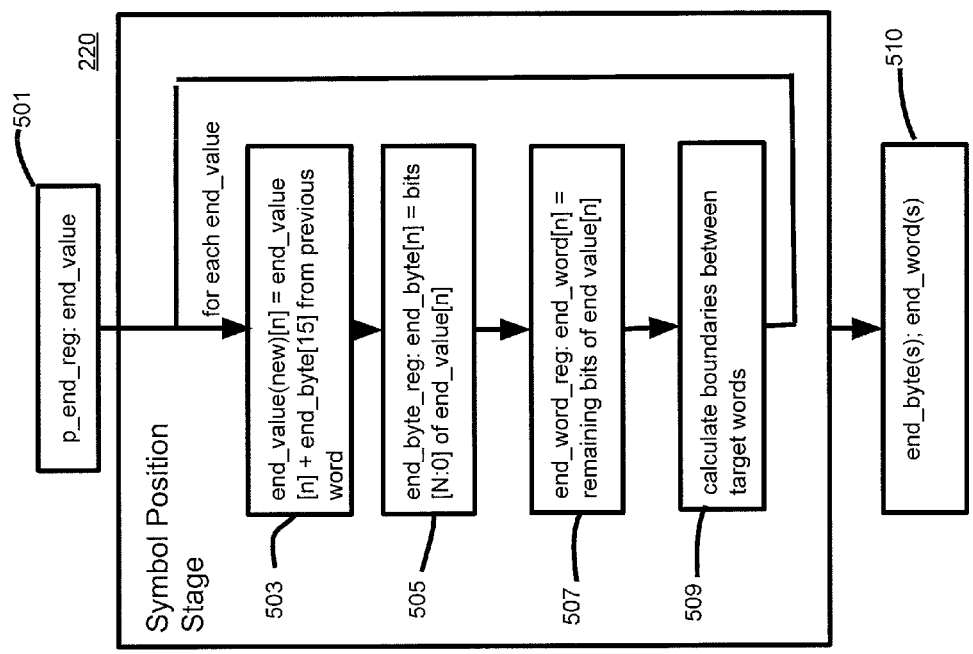
FIG. 5 is a block diagram of the Symbol Positioning Stage in the Length Module.

FIG. 5 is a block diagram illustrating Stage 2: Symbol Positioning 220 in the Length Module 200. Stage 2 separates end_values into end_bytes and end_words. A resulting end_byte indicates the absolute position in the output stream where a given symbol ends. The end_word indicates the number of uncompressed 16 byte target words are between the start of symbol 0 and the end of the current symbol.

In the Symbol Positioning stage, at step 503, the remaining byte offset of the previous source word (end_byte[15] from previous word) is added to (end_value[n]) to obtain (end_value(new)[n]) to align end_bytes to the absolute byte positions in the destination words. The Symbol Positioning stage 220 then splits end_value for each symbol into end_byte (505) and end_word (507). Assuming a 16-symbol word, the end_byte is Bits[3:0] of the end_value. However, the end_byte is dependent on the WIDTH (number of symbols per word). For power-of-2 width, the end_byte is log 2(WIDTH). For non-power-of-2 width, the end_byte requires a mod(remainder) operation. The end_word is the remaining bits of the end_value.

Finally at step 509 the symbol position stage calculates where the boundaries between target words will be. In particular, boundaries between target words are detected by determining where end_word changes.

Figure 6:
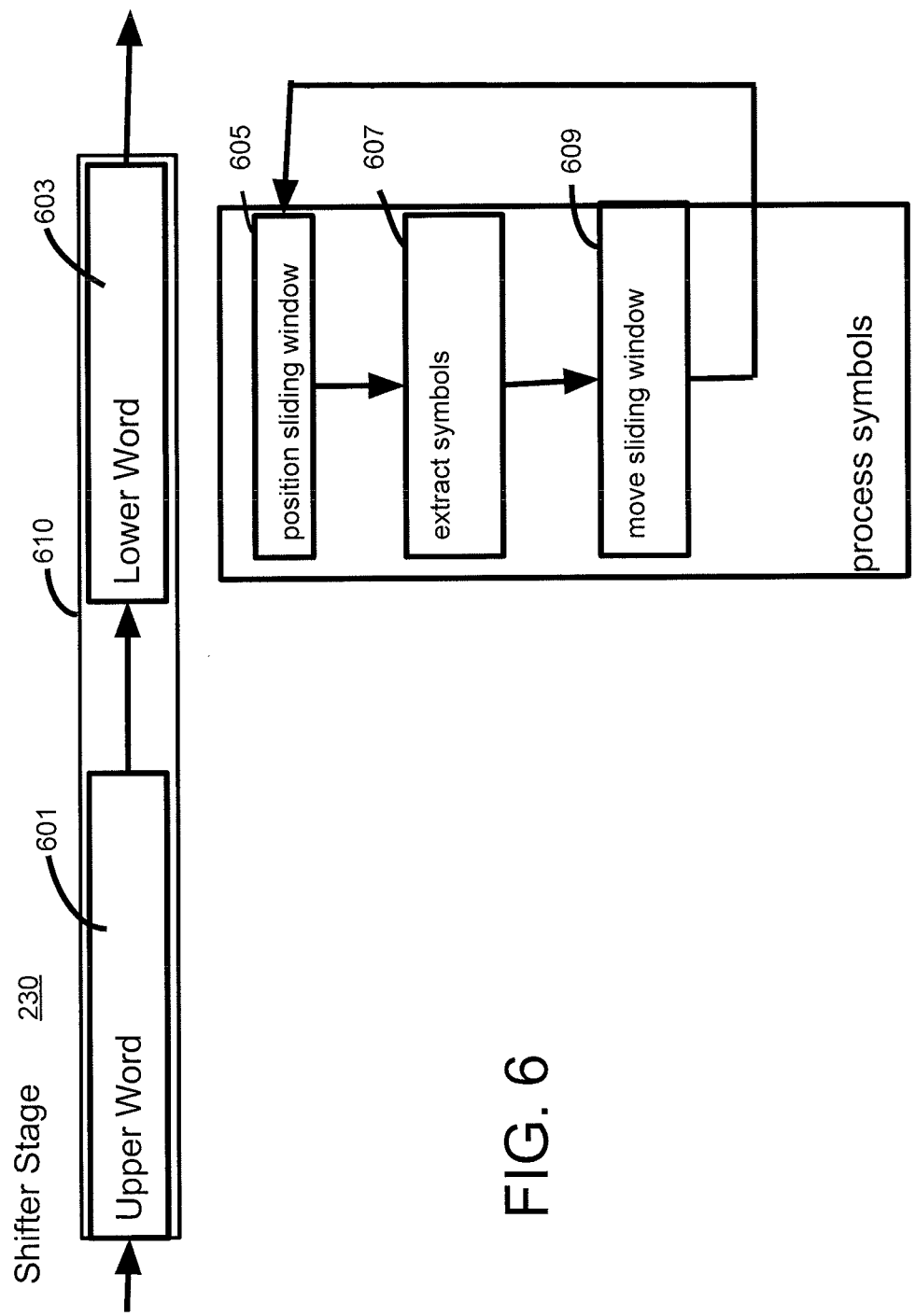
FIG. 6 is a block diagram of the Shifter Stage in the Length Module.

FIG. 6 is a block diagram illustrating Stage 3: Shifter 230. In an example embodiment, the shifter stage 230 includes a shift register 610 that holds two consecutive 16-symbol source words, an upper word 601 of the shift register 610, and a lower word 603 of the shift register 610. A sliding window selects groups of symbols to be transferred to the Mapper 240. At step 605, the sliding window selects up to WIDTH symbols from the lower word 603, but not crossing a boundary between target words (determined in the symbol positioning stage 220), and at step 607 transfers the selected symbols to the Mapper stage 240. The sliding window continues selection (step 609) as all symbols from the first source word, stored in the lower word 603, are consumed. Because symbols at this stage can be various lengths, there may be overlap between the consecutive words. The sliding window moves toward the end of the upper word. As the end of the shift register 610 is detected, the second source word is shifted into the lower word 603 and a new second source word is reloaded from the symbol positioning stage.

In an example embodiment of the Shifter 230, states of each symbol are maintained. In particular, in addition to the end_word and end_byte values maintained for each symbol, there are three possible states of each symbol:

a. "done": processing of the symbol has completed;
b. "non-zero": the processing of the symbol has not completed and the end_word value is non-zero; and
c. "0": the processing of the symbol has not completed and the end_word value is zero.

The states are initialized to "0" or "non-zero" as the word is transferred into the upper word 601 of the shift register 610 based on the end_word value calculated in the Symbol Positioning stage 220.

States of symbols in the lower word 603 and the upper word 601 may have the following properties: The lower word 603 of the shift register 610, starting with symbol zero and ending with symbol WIDTH−1, contains zero or more symbols in the "done" state, followed by zero or more symbols in the "0" state, followed by zero or more symbols in the "non-zero" state. The last symbol of the lower word 603 will not transition to the "done" state. The upper word 601 of the shift register 610, starting with symbol zero and ending with symbol WIDTH−1, contains zero or more symbols in the "0" state followed by zero or more symbols in the "non-zero" state.

Embodiments are not limited to encoding states as "0", "done", or "non-zero", and may instead encode the states differently or may maintain an additional state that is derivable from the end_word, end_byte, and state values of the symbol and adjacent symbols.

The selection of the symbols for the sliding window is controlled by the states of the symbols. A symbol in the lower word 603 can be selected to be in the sliding window when it is in the "0" state or immediately after a symbol in the "0" state. A symbol in the upper word 601 can be selected to be in the sliding window when:

The last symbol in the lower word 603 is in the "0" state;

The symbol in the upper word 601 is at the same position as a symbol in the lower word 603 that is in the "done" state.

The symbol in the upper word 601 is in the "0" state, or is immediately after a symbol in the "0" state, or is symbol 0.

The sliding window may operate in accordance with the following conditions. The first symbol in the sliding window will be the first symbol from the lower word 603 of the shift register that is not in the "done" state. Symbols that are selected are contiguous: the first symbol of the upper word 601 of the shift register follows immediately after the last symbol of the lower word 603. There exists a single symbol of the lower word 603 of the shift register, either symbol 0 if it is not in the "done" state or another symbol that is not in the "done" state and immediately follows a symbol that is in the "done" state. The position of this single symbol controls a multiplexer that directs the selected symbols to the Mapper stage 240.

After a group of symbols selected by the sliding window are transferred into the Mapper stage 240, the shift register is updated. If the last symbol of the lower word 603 was in the "0" state or if the last symbol of the lower word 603 had an "end_word" value of 1 and an "end_byte" value of 0, the shift register advances: the contents of the upper word 601 are moved to the lower word 603 and the upper word 601 is loaded from the symbol positioning stage 220. As the shift register advances the states of the symbols from the upper word 601 are modified: if the symbol was in the sliding window and in the "0" state or if the symbol was in the sliding window and had an end_word value of 1 and an end_byte value of 0, the symbol transitions to the "done" state. If the symbol was in the "non-zero" state and the last symbol of the sliding window was in the "non-zero" state, the end_word value is decremented and the state is updated based on the new value of end_word.

If the shift register did not advance, the states of the symbols in the lower word 603 are modified (in a similar way): if the symbol was in the "0" state or if the symbol had an end_word value of 1 and an end_byte value of 0, the symbol transitions to the "done" state. If the symbol was in the "non-zero" state and the last symbol of the sliding window was in the "non-zero" state, the end_word value is decremented and the state is updated based on the new value of end_word.

Figure 7:
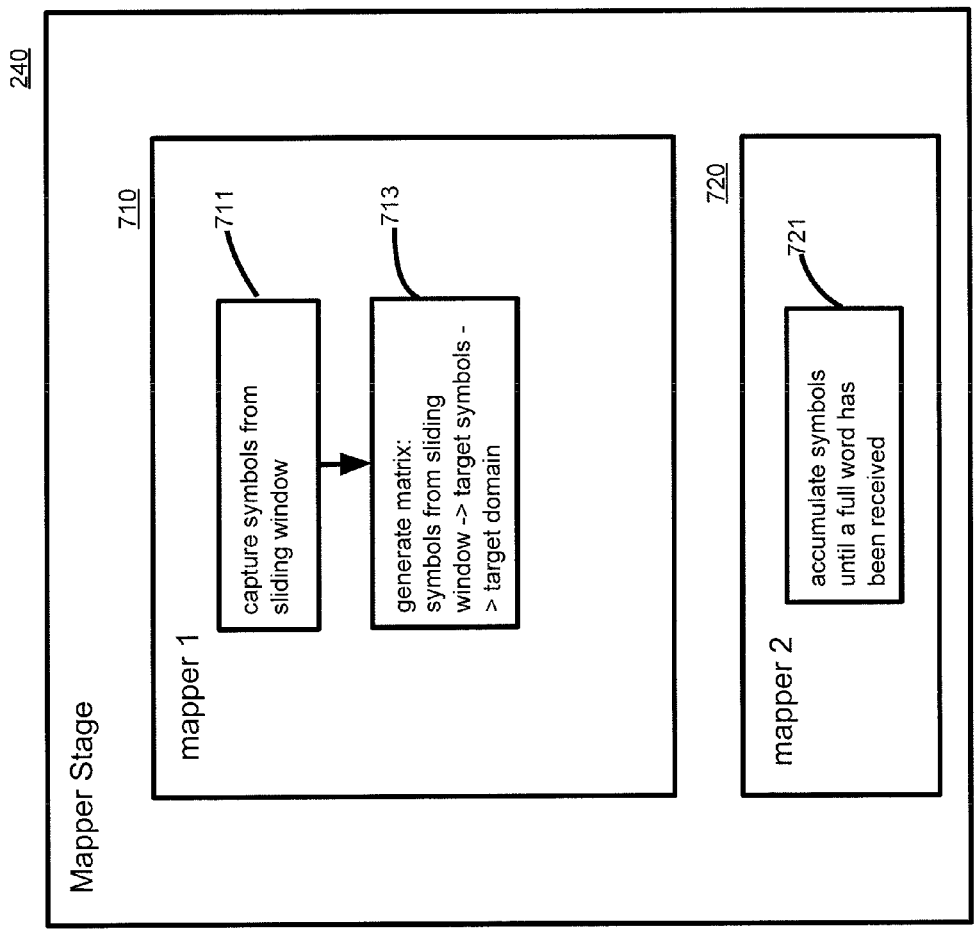
FIG. 7 is a block diagram of the Mapper Stage in the Length Module.

FIG. 7 is a block diagram illustrating Stage 4: Mapper 240 of the Length Module 200. The Mapper 240 is processed in two stages, Mapper 1 (710) and Mapper 2 (720). Mapper 1 (710) constructs a matrix (mapper_matrix) which is used to control loading of target words into the Mapper 2 stage (720).

At step 711, the Mapper 1 stage (710) captures the symbols as source symbols, and associated end_byte values, extracted by the sliding window. At step 713, the end_byte values are used to construct a matrix to map the source symbols into target symbols (symbols at appropriate positions in the output stream). The Mapper 2 stage (720) accumulates target symbols until a full word has been received. A result of the Mapper Stage 240 are symbols including either literal bytes or distances to an earlier symbol that is to be repeated.

<Distance Module—Functional Arrangement>

The remaining stages in the pipeline are in the Distance Module 800. The Distance Module 800 resolves the distances for distance symbols coming off of the length module.

The Distance Module 800 resolves distances by treating them as pointers. In an embodiment, the technique of using pointers takes multiple steps where in earlier steps a pointer may be resolved by replacing the pointer with a new pointer. The order of steps is such that the new pointer will be resolved again later, and at the final step all pointers resolve back to literals. This technique of replacing pointers instead of using, for example, relative distances, avoids the need to use adders.

Figure 8:
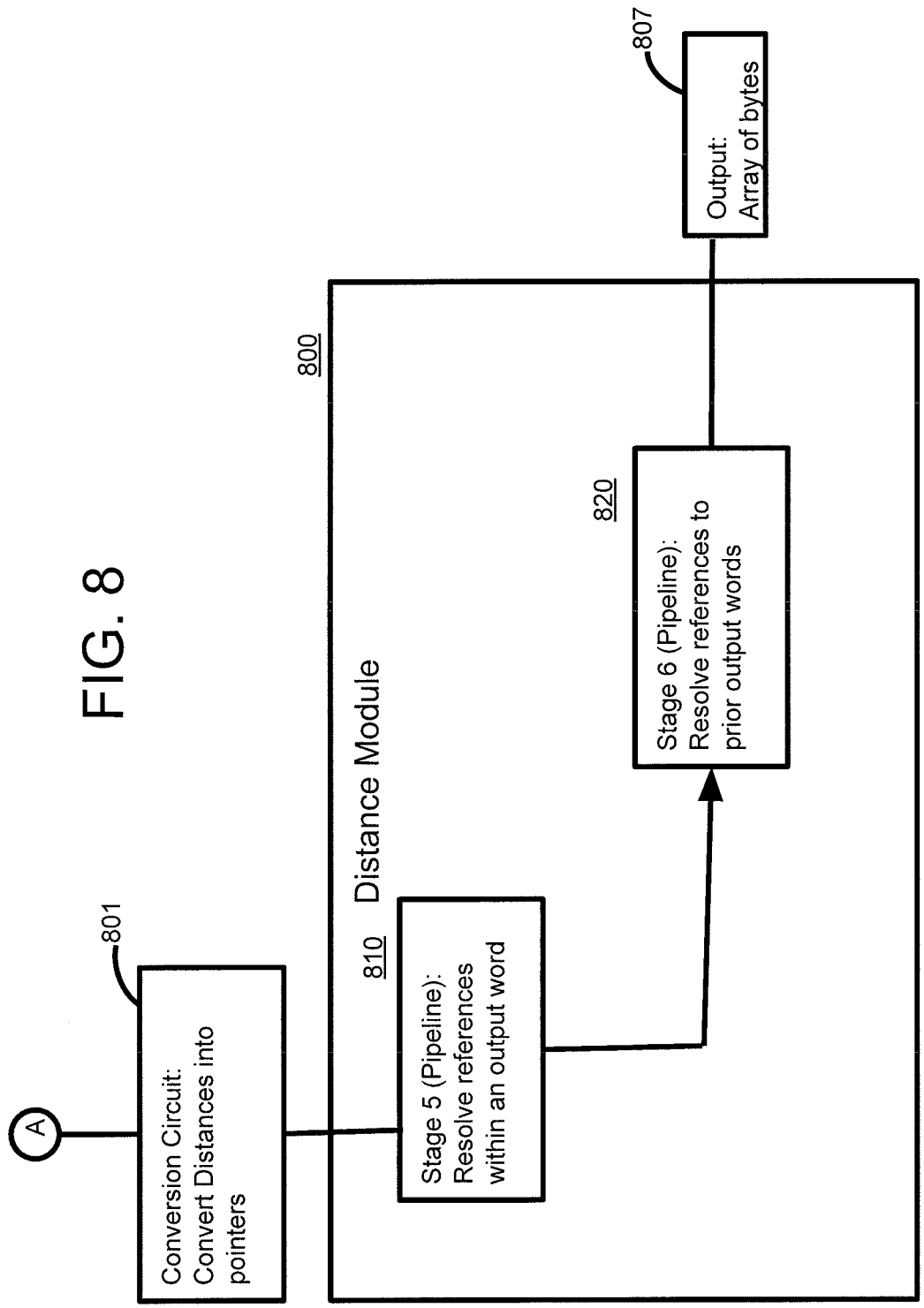
FIG. 8 is a block diagram of the Distance Module.

FIG. 8 illustrates stages in the Distance Module 800. Prior to entry into the stages, a conversion circuit 801 is provided to convert the distances into pointers that contain byte and word fields. The byte field represents the absolute byte position within the output stream. The word field represents the relative word position. Thus, the conversion circuit 801 converts symbols to symbols including either literal bytes or <word, byte> pointers.

The Distance Module 800 resolves distances using two pipelined stages. A stage 5 (810) resolves pointers within an output word. A stage 6 (820) resolves pointers to prior output words.

Figure 9:
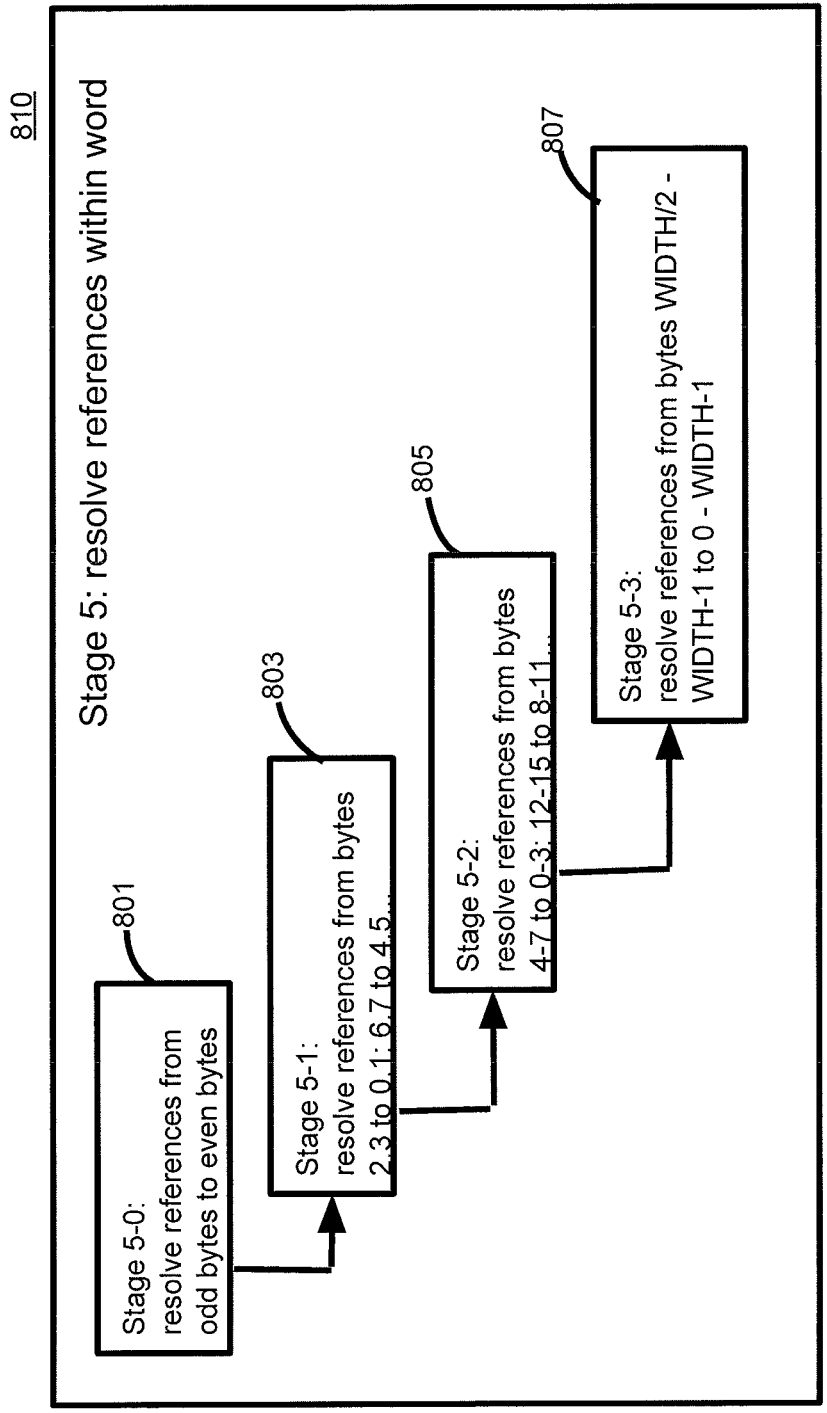
FIG. 9 is a block diagram of the Stage for resolving references within a word in the Distance Module.

FIG. 9 is a block diagram for Stage 5 (810).

Stage 5 (810) resolves the pointers within the same output word (e.g., word field=0) across a number of pipe slots. The pointers are resolved into either literal values or pointers to prior words. The Stage 5 (810) resolves pointers using the following stages:

a. Sub-stage 5-0 (801): pointers from symbol 1 to symbol 0, 3 to 2, 5 to 4, 7 to 6, 9 to 8, 11 to 10, 13 to 12, and 15 to 14 are resolved. Pointers are resolved by copying the target symbol to the referrer. For example, if symbol 1 is a pointer with <word=0,byte=0>, symbol 0 is copied into symbol 1.

b. Sub-stage 5-1 (803): Pointers from symbols 2 or 3 to 0 or 1, 6 or 7 to 4 or 5, 10 or 11 to 8 or 9, and 14 or 15 to 12 or 13 are resolved.

c. Sub-stage 5-2 (805): Pointers from symbols 4 through 7 to 0 through 3 and 12 through 15 to 8 through 11 are resolved.

d. Sub-stage 5-3 (807): Pointers from symbols 8 through 15 through 0 through 7 are resolved.

Thus, Stage 5 (810) produces symbols that are literals or pointers with word>0.

Figure 10:
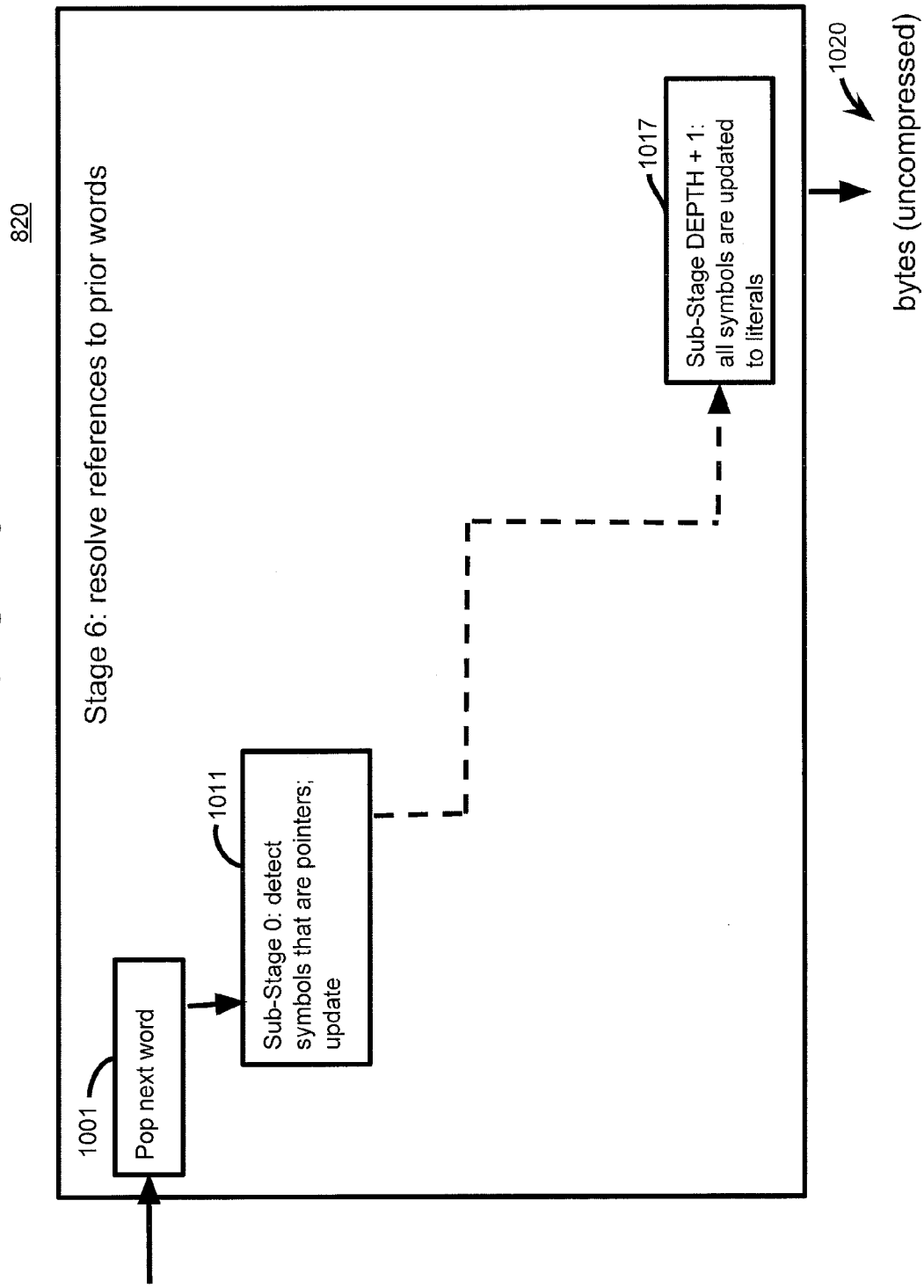
FIG. 10 is a block diagram of the Stage in the Distance Module for resolving references to prior words.

FIG. 10 is a block diagram for Stage 6 (820).

Stage 6 (820) resolves the references to prior output words. Stage 6 (820) is a DEPTH+1 stage pipeline, where DEPTH represents the maximum distance/16. Stages within the Stage 6 pipeline are referred to as sub-stages. As an example, for a maximum distance of 128, DEPTH would be 8. In an embodiment having a dictionary of 256 bytes, there would be 17 stages.

A next word is transferred (1001) into the Stage. In each sub-stage except the last, for each symbol the sub-stage (1011) detects whether the symbol is a pointer to the word in the final sub-stage by decoding whether the symbol is a pointer and checking the word value. If so, the sub-stage (1011) updates its symbol with the appropriate symbol in the final sub-stage by muxing in the appropriate symbol based on the pointer byte value. By the final sub-stage (1017) all symbols are literals, and are output as uncompressed bytes (1020).

Literals output from Stage 6 can be presented directly to the output stream.

Also, Stage 6 uses a pipeline to update the pointers as the pointed-to bytes come off the end of the pipeline. Subsequently, Stage 6 does not need to save recent bytes in an array and use a lookup port in the array to resolve the pointers.

<Length Module—Operation>

The operation of the functional block 100 will be described. The operation represents a decompression method for data compressed using the LZ77 technique. The length module 200 expands the lengths in the <length, distance> pair symbols.

Figure 11:
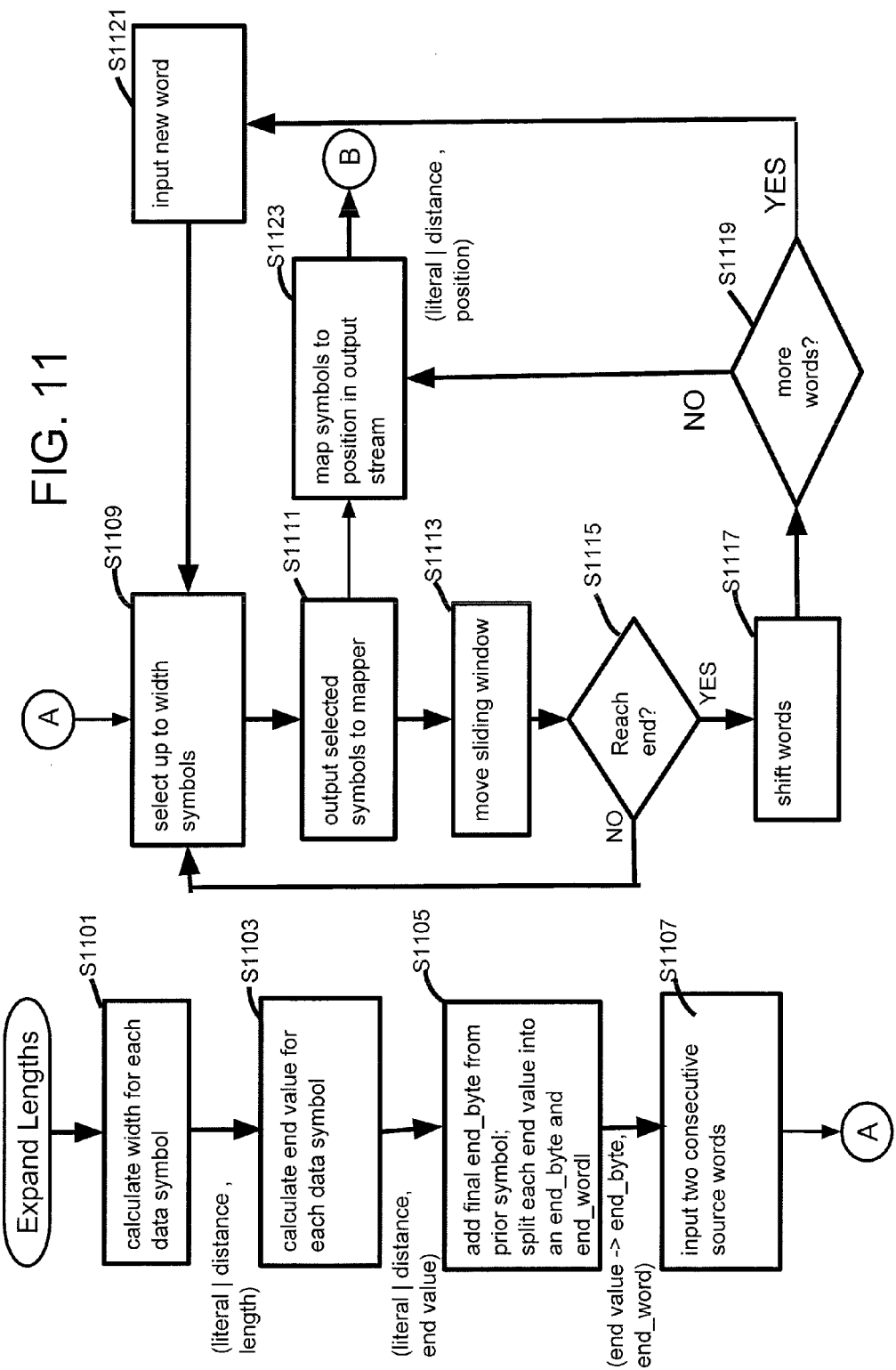
FIG. 11 is a flow diagram for the Length Module.
Figure 12:
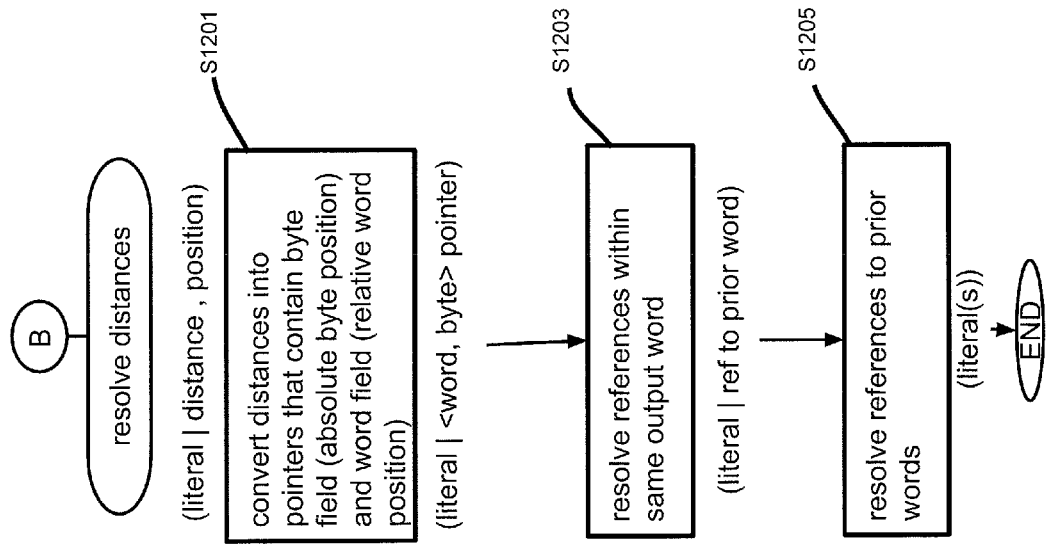
FIG. 12 is a flow diagram for the Distance Module.

FIG. 11 is a flow diagram for the operation of the Length Module of expanding the lengths. FIG. 12 is a flow diagram for the operation of the Distance Module of resolving the distances.

In FIG. 11, step S1101 is a preliminary step in which the width, in bytes, of each data symbol is calculated. Invalid symbols are assigned a width of zero bytes. Literal symbols are 1 byte wide. Length-distance symbols are length bytes wide. The length can be removed from the length-distance pairs, such that the symbols are <distance>.

In step S1103, an end_value of each data symbol is calculated. The end_value represents the cumulative length from the first symbol in the word.

In step S1105, the end_byte of the last symbol in the previous word is added to the end_value(s), and the resulting end_value(s) are split into an end_byte and an end_word. The end_bytes and end_words are used in control of shift and map operations in later steps. Also, boundaries between target words are calculated.

In steps S1107 to S1119, a shift operation is performed to transfer symbols to a map step S1121, up to WIDTH symbols at a time. The shift operation uses a sliding window in performing the selection of symbols.

In particular, in step S1107, the shift operation initially obtains two consecutive source words, a new word and an old word, and subsequently transfers the old word into the new word register, and transfers a new word into the new word register.

In step S1109, a sliding window selects up to WIDTH symbols. Because of invalid symbols and <distance> symbols that can have various lengths, the WIDTH can vary. Subsequently, the sliding window can reach a point where symbols are read from part of the old word and part of the new word in selecting WIDTH symbols. Detection of an end of a word is controlled by the end_words. In step S1111, selected symbols are extracted for transfer to the map step S1123. At step S1113, an operation of moving the sliding window to the next set of WIDTH symbols is performed. In moving the sliding window, in step S1115, the end_word is checked to determine if an additional symbol(s) needs to be obtained beyond the end of the present word. The operation of selecting symbols is repeated.

At step S1117, a new word is transferred by moving the previous new word to the old word register and at step S1119, if there are more words, step S1121, transferring in the new word to the new word register.

At step S1123, the selected symbols, and associated end_byte values, are received from the sliding window and are mapped to their appropriate positions in the output stream. After this step, symbols are either literal bytes or distances.

<Distance Module—Operation>

FIG. 12 is a flow diagram for operation of the Distance Module 800. As described above, the Distance Module 800 resolves the distances. Distances are resolved by treating them as pointers. This step takes multiple steps where in earlier steps a pointer may be "resolved" by replacing the pointer with a different pointer. The order of steps is such that the new pointer will be resolved again later, and at the final step all pointers resolve back to literals. This technique of replacing pointers instead of using, for example, relative distances, avoids the need to use an addition step.

In step S1201, distances are converted into pointers that contain a byte field and a word field. The resulting symbols are either literal bytes or <word, byte> pointers. The byte field represents the absolute byte position within the output stream. The word field represents the relative word position.

In step S1203, pointers within the same output word are resolved into either literal bytes or pointers to prior words.

In step S1205, the pointers to prior words are resolved until all symbols are literals.

<Application Specific Integrated Circuit Design Flow>

The disclosure relates to a functional block performing decompression, particularly for specification at the RTL code level, to be integrated into an integrated circuit (ASIC). The integrated circuit has an intended application in an IP core for a System on Chip (SOC), in particular, for performing hardware accelerated compression/decompression of main memory in a computer system. In such case, industry standard ASIC flow is applicable for manufacturing the present disclosure.

Figure 13:
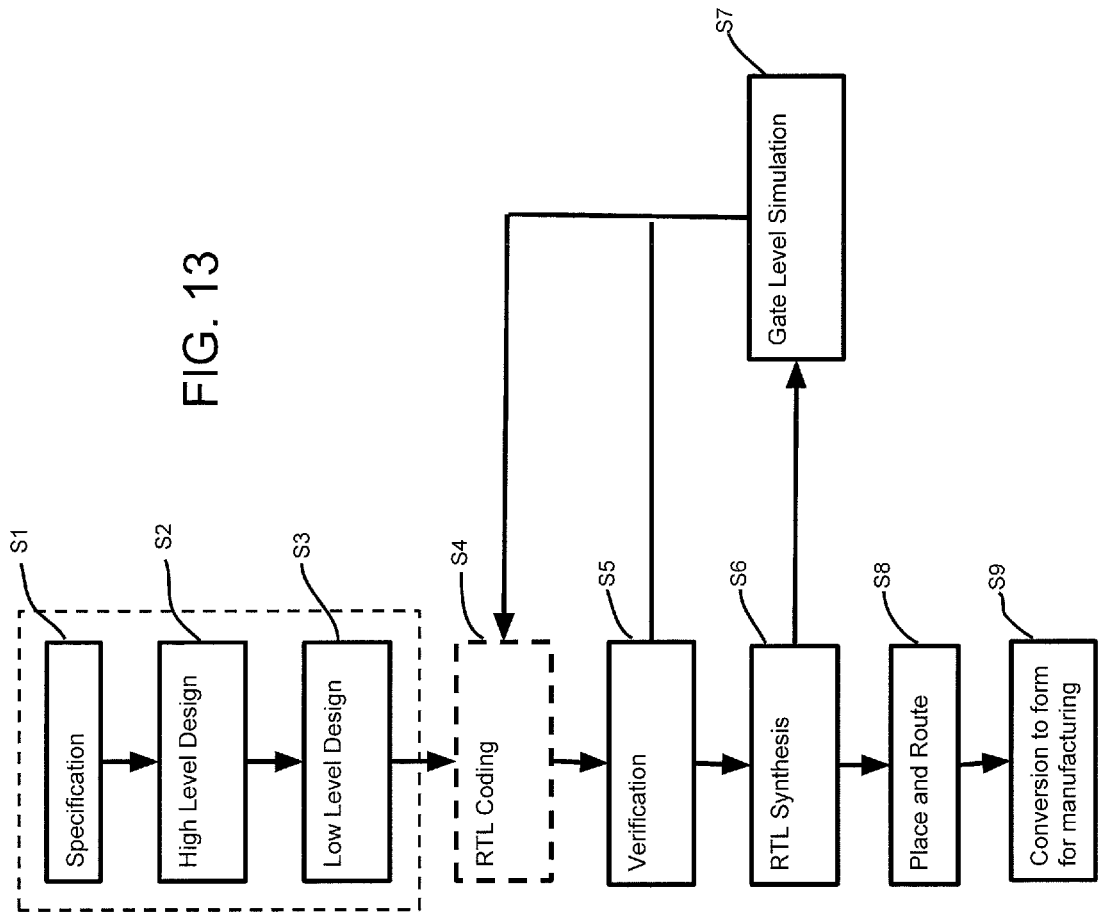
FIG. 13 is a typical ASIC flow for converting a design to a form that can be manufactured.

The present disclosure is suitable for coding in RTL. A version of the functional block has been implemented in Verilog RTL. As is known in the art, Verilog RTL, as well as other hardware description languages, are run using a general purpose computer. FIG. 13 is a flow diagram illustrating a general ASIC flow. In the case of the present disclosure, steps of specification (S1), high level design (S2), and low level design (S3) are presumed to have been previously been performed. Steps of RTL coding (S4), simulation/verification (S5, S7), RTL synthesis (S6), and place and route (S8) can also be performed using a general purpose computer. The final manufacturing step (S9) is performed in a real environment. The RTL synthesis (S6) step produces a netlist. A place and route tool takes the netlist and produces a file to be used for fabrication of the ASIC.

Alternative Embodiments

The embodiments described above assume a word that has 16 symbols. However, the invention is not limited to a functional block that processes 16 symbol words. The functional block 100 can be modified to handle power-of-two symbols in a word. Larger number of symbols can be accomplished using a greater number of pipeline stages. Non-power-of-two symbols can be accommodated by adjusting the generation of end_byte and end_word.

The functional block 100 may also be modified to produce an output that is wider than the input. In such case, the stages up to and including the shifter stage 230a, 230b would be designed according to the input width. The remaining stages would be designed for the output width.

The final stage 820 in the pipeline can be extended to multiple steps in order to resolve pointers to words at longer distances. This could be accomplished by a first step of looking up longer distant word pointers, e.g., at a distance greater than a predetermined distance, in RAM. The second step can be accomplished in the stages of the F Pipeline described above.

<Computer System Implementations>

The apparatus and techniques described herein relate to a design of a functional block in an Application Specific Integrated Circuit for decompression in hardware. However, one of ordinary skill in the art would understand that the technique for decompression used in the functional block is applicable to other forms of implementation, such as in software, or firmware.

Figure 14:
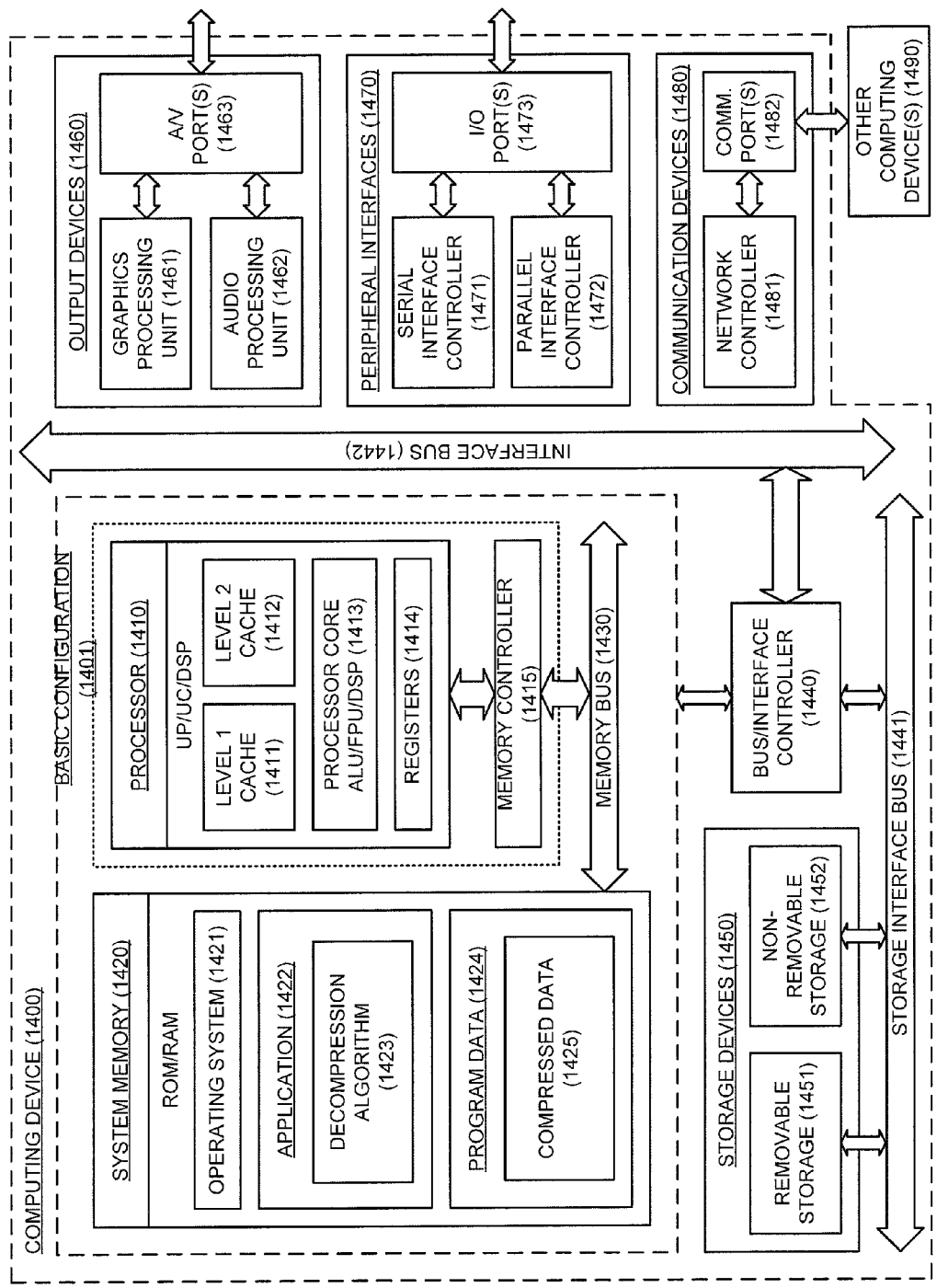
FIG. 14 is a block diagram illustrating an example general purpose computing device.

FIG. 14 is a block diagram illustrating an example general purpose computing device 1400 that is arranged for performing the technique for decompression, for example, in accordance with the method in FIGS. 11 and 12. In a very basic configuration 1401, computing device 1400 typically includes one or more processors 1410 and system memory 1420. A memory bus 1430 can be used for communicating between the processor 1410 and the system memory 1420.

Depending on the desired configuration, processor 1410 can be of any type including but not limited to a microprocessor (µP), a microcontroller (µC), a digital signal processor (DSP), or any combination thereof. Processor 1410 can include one more levels of caching, such as a level one cache 1411 and a level two cache 1412, a processor core 1413, and registers 1414. The processor core 1413 can include an arithmetic logic unit (ALU), a floating point unit (FPU), a digital signal processing core (DSP Core), or any combination thereof. A memory controller 1415 can also be used with the processor 1410, or in some implementations the memory controller 1415 can be an internal part of the processor 1410.

Depending on the desired configuration, the system memory 1420 can be of any type including but not limited to volatile memory (such as RAM), non-volatile memory (such as ROM, flash memory, etc.) or any combination thereof. System memory 1420 typically includes an operating system 1421, one or more applications 1422, and program data 1424. Application 1422 includes a decompression algorithm 1423. Program Data 1424 includes compressed data 1425, as described above. In some embodiments, application 1422 can be arranged to operate with program data 1424 on an operating system 1421. This basic configuration is illustrated in FIG. 14 by those components within dashed line 1401.

Computing device 1400 can have additional features or functionality, and additional interfaces to facilitate communications between the basic configuration 1401 and any required devices and interfaces. For example, a bus/interface controller 1440 can be used to facilitate communications between the basic configuration 1401 and one or more data storage devices 1450 via a storage interface bus 1441. The data storage devices 1450 can be removable storage devices 1451, non-removable storage devices 1452, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media can include volatile and nonvolatile, removable and non-removable media implemented in any method or technology for storage of information, such as computer readable instructions, data structures, program modules, or other data.

System memory 1420, removable storage 1451 and non-removable storage 1452 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 1400. Any such computer storage media can be part of device 1400.

Computing device 1400 can also include an interface bus 1442 for facilitating communication from various interface devices (e.g., output interfaces, peripheral interfaces, and communication interfaces) to the basic configuration 1401 via the bus/interface controller 1440. Example output devices 1460 include a graphics processing unit 1461 and an audio processing unit 1462, which can be configured to communicate to various external devices such as a display or speakers via one or more A/V ports 1463. Example peripheral interfaces 1470 include a serial interface controller 1471 or a parallel interface controller 1472, which can be configured to communicate with external devices such as input devices (e.g., keyboard, mouse, pen, voice input device, touch input device, etc.) or other peripheral devices (e.g., printer, scanner, etc.) via one or more I/O ports 1473. An example communication device 1480 includes a network controller 1481, which can be arranged to facilitate communications with one or more other computing devices 1490 over a network communication via one or more communication ports 1482. The communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared (IR) and other wireless media. The term computer readable media as used herein can include both storage media and communication media.

Computing device 1400 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 1400 can also be implemented as a personal computer including both laptop computer and non-laptop computer configurations.

There is little distinction left between hardware and software implementations of aspects of systems; the use of hardware or software is generally (but not always, in that in certain contexts the choice between hardware and software can become significant) a design choice representing cost vs. efficiency trade-offs. Though the above-described functional block 100 is for a hardware implementation, the preferred vehicle (e.g., hardware, software, and/or firmware) will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following:

a. a recordable type medium such as a floppy disk, a hard disk drive, a Compact Disc (CD), a Digital Video Disk (DVD), a digital tape, a computer memory, etc.; and b. a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and/or control motors (e.g., feedback for sensing position and/or velocity; control motors for moving and/or adjusting components and/ or quantities). A typical data processing system may be implemented utilizing any suitable commercially available components, such as those typically found in data computing/ communication and/or network computing/communication systems.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. An integrated circuit, comprising:
a decompression block that receives as input a compressed input stream made up of symbols in M words, each word having up to N symbols, where M and N are a positive integers, and that outputs an uncompressed output stream made up of an array of literals, the array of literals being original literals before compression;
the decompression block is configured as a pipeline that includes a length module and a distance module, the length module evaluates a length for each symbol, the distance module resolves the distances in the at least one length-distance pair;
the length module comprising:
a shifter stage configured to store two consecutive words, and control a sliding window of S symbols, where S is a positive integer, in accordance with end word values in order to extract literals or distances, the end word values represent the number of uncompressed words between the start of the first symbol and the end of a current symbol;
a mapper stage configured to receive the literals or distances from the sliding window and using end byte values map the literals or distances to positions in the output stream, the end byte values represent the absolute position in the output stream where a given symbol ends;
the distance module comprising:
a pointer replacement stage configured to replace distances, represented as pointers within an output word, with either literals or other pointers to prior words;
a resolution stage configured to replace the other pointers with literals, and output literals and the replacement literals to the uncompressed output stream.

2. The integrated circuit of claim 1, wherein the length module further comprises:
an end value pipeline having a plurality of stages that calculate for each of the N symbols an end value as a cumulative length from a first symbol to the Nth symbol in the array of N symbols; and
a symbol position stage that adds an end byte from a last symbol of a previous word to the cumulative length for each symbol and that splits each end value into an end byte and an end word, to obtain the end byte values and the end word values.

3. The integrated circuit of claim 2, wherein the end values are split into two equal sized fields.

4. The integrated circuit of claim 3, wherein the plurality of stages in the end value pipeline include adders that perform cumulative additions based on results of earlier stage adders, wherein adders are split across two or more of the stages.

5. The integrated circuit of claim 1, wherein the shifter stage uses the end word values to determine that remaining bits in the sliding window are read from the second of the two consecutive words, and to determine that a new word needs to be accepted from a prior stage.

6. The integrated circuit of claim 1, wherein the pointer replacement stage and the resolution stage are pipelines.

7. The integrated circuit of claim 6, wherein the pipeline in the resolution stage has Depth+1 stages, where Depth is a dictionary size in bytes divided by 16.

8. The integrated circuit of claim 1, wherein the resolution stage has two steps in which, in the first step pointers longer than a predetermined distance are resolved by lookup in an external memory, and the second step resolves pointers in a pipeline.

9. A method of decompressing a compressed input stream of symbols to produce an output stream of literals, comprising:
performing a length operation on the input stream to produce an array of literal bytes and distances;
performing a distance operation to produce an array of literals from the array of literal bytes and distances,
wherein the length operation comprises:
receiving a word from the input stream of symbols, the word including N symbols;
performing a shifter stage, the shifter stage stores two consecutive words from the input stream, and controls a sliding window of S symbols, where S is a positive integer, in accordance with end word values in order to extract literals or distances, the end word values represent the number of uncompressed words between the start of the first symbol and the end of a current symbol;
performing a mapper stage to receive the literals or distances from the sliding window and using end byte values to map the literals or distances to positions in the output stream, the end byte values represent the absolute position in the output stream where a given symbol ends;
wherein the distance operation comprises:
performing a pointer replacement stage to replace distances, represented as pointers within an output word, with either literals or other pointers to prior words;

performing a resolution stage to replace the other pointers with literals; and outputting to the output stream an array of literals based on the replaced pointers.

10. The method of claim 9, wherein the length operation further comprises:

calculating for each of the N symbols an end value as a cumulative length from a first symbol to the Nth symbol in the array of N symbols;

adding an end byte from a last symbol of a previous word to the cumulative length for each symbol; and splitting each end value into an end byte and an end word, to obtain the end byte values and the end word values.

* * * * *